(12) United States Patent
Jung

(10) Patent No.: US 10,897,021 B2
(45) Date of Patent: Jan. 19, 2021

(54) DISPLAY DEVICE AND METHOD FOR MANUFACTURING DISPLAY DEVICE

(71) Applicant: Samsung Display Co., Ltd., Yongin-si (KR)

(72) Inventor: Kyu Bong Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/747,598

(22) Filed: Jan. 21, 2020

(65) Prior Publication Data

US 2020/0152896 A1    May 14, 2020

Related U.S. Application Data

(63) Continuation of application No. 16/241,789, filed on Jan. 7, 2019, now Pat. No. 10,593,899.

(30) Foreign Application Priority Data

Apr. 2, 2018  (KR) .................. 10-2018-0038285

(51) Int. Cl.
*H01L 51/00*  (2006.01)
*H01L 51/52*  (2006.01)
(Continued)

(52) U.S. Cl.
CPC ....... *H01L 51/0097* (2013.01); *G09G 3/3225* (2013.01); *H01L 27/3246* (2013.01);
(Continued)

(58) Field of Classification Search
CPC ............ H01L 27/3276; H01L 27/3246; H01L 51/0097; H01L 51/56; H01L 51/5234; H01L 51/5281; H01L 51/5218; H01L 51/5246; H01L 51/5253; H01L 2227/323; H01L 25/0753; H01L 23/3121;
(Continued)

(56) References Cited

U.S. PATENT DOCUMENTS 7,348,492 B1  3/2008  Kawai et al.
9,706,607 B2  7/2017  Kim et al.
(Continued)

FOREIGN PATENT DOCUMENTS

KR  10-2016-0130921  11/2016
KR  10-2017-0093835  8/2017

OTHER PUBLICATIONS

Non-Final Office Action dated Jun. 26, 2019, in U.S. Appl. No. 16/241,789.
(Continued)

*Primary Examiner* — Errol V Fernandes
*Assistant Examiner* — Jeremy J Joy
(74) *Attorney, Agent, or Firm* — H.C. Park & Associates, PLC

(57) ABSTRACT

A display device including a display panel having a display area and a non-display area, the non-display area being disposed at a peripheral portion of the display area and having a bending area; an integrated circuit (IC) disposed in the non-display area to drive the display panel; a first layer formed between the display area and the IC and covering the bending area; and a first member covering the IC and the first layer and overlapping with the bending area.

14 Claims, 9 Drawing Sheets

(51) Int. Cl.
  *H01L 51/56* (2006.01)
  *H01L 27/32* (2006.01)
  *H05K 1/18* (2006.01)
  *G09G 3/3225* (2016.01)

(52) U.S. Cl.
  CPC ...... *H01L 27/3276* (2013.01); *H01L 51/5218* (2013.01); *H01L 51/5234* (2013.01); *H01L 51/5246* (2013.01); *H01L 51/5253* (2013.01); *H01L 51/5281* (2013.01); *H01L 51/56* (2013.01); *H05K 1/189* (2013.01); *H01L 2227/323* (2013.01); *H05K 2201/10128* (2013.01)

(58) Field of Classification Search
  CPC . H01L 23/5387; H01L 23/5386; H01L 33/62; G09G 3/3225; H05K 1/189; H05K 2201/10128
  See application file for complete search history.

(56) References Cited

U.S. PATENT DOCUMENTS

| | | | |
|---|---|---|---|
| 9,991,467 B2 | 6/2018 | Namkung et al. | |
| 2011/0007042 A1 | 1/2011 | Miyaguchi | |
| 2013/0148312 A1* | 6/2013 | Han | H05K 1/028 361/736 |
| 2014/0001966 A1* | 1/2014 | Cho | G09G 3/3208 315/161 |
| 2014/0042406 A1* | 2/2014 | Degner | H01L 27/3297 257/40 |
| 2014/0118969 A1* | 5/2014 | Lee | H01L 23/552 361/749 |
| 2014/0239276 A1* | 8/2014 | Lin | H01L 51/5246 257/40 |
| 2014/0306941 A1* | 10/2014 | Kim | H04M 1/0268 345/204 |
| 2015/0382446 A1* | 12/2015 | Kwon | H05K 1/028 174/251 |
| 2016/0088726 A1* | 3/2016 | Jeon | H05K 1/147 361/749 |
| 2016/0105950 A1* | 4/2016 | Drzaic | H05K 1/0296 174/251 |
| 2016/0174304 A1* | 6/2016 | Kim | H01L 51/5253 313/511 |
| 2016/0181345 A1* | 6/2016 | Lee | H05K 1/028 257/40 |
| 2016/0204183 A1* | 7/2016 | Tao | H01L 25/167 257/40 |
| 2017/0047547 A1* | 2/2017 | Son | H01L 25/167 |
| 2017/0090661 A1* | 3/2017 | Kim | G06F 3/0412 |
| 2017/0117346 A1* | 4/2017 | Kim | H01L 23/49555 |
| 2017/0148859 A1* | 5/2017 | Nishinohara | H01L 51/524 |
| 2017/0293194 A1* | 10/2017 | Hou | G06F 1/1652 |
| 2017/0294621 A1* | 10/2017 | Higano | G02F 1/13452 |
| 2018/0047938 A1* | 2/2018 | Kishimoto | H01L 27/323 |
| 2018/0081399 A1* | 3/2018 | Kwon | G06F 1/1652 |
| 2018/0180911 A1* | 6/2018 | Odaka | H01L 51/0097 |
| 2018/0182829 A1* | 6/2018 | Shin | H01L 51/56 |
| 2018/0196300 A1* | 7/2018 | Jung | G02F 1/13452 |
| 2018/0217640 A1 | 8/2018 | Nishikawa | |

OTHER PUBLICATIONS

Notice of Allowance dated Oct. 3, 2019, in U.S. Appl. No. 16/241,789.

* cited by examiner

DISPLAY DEVICE AND METHOD FOR MANUFACTURING DISPLAY DEVICE

CROSS-REFERENCE TO RELATED APPLICATION

This application is a Continuation of U.S. patent application Ser. No. 16/241,789, filed Jan. 7, 2019, which claims priority from and the benefit of Korean Patent Application No. 10-2018-0038285, filed on Apr. 2, 2018, each of which is incorporated by reference for all purposes as if fully set forth herein.

BACKGROUND

Field

Exemplary implementations of the invention relate generally to a display device and a method for fabricating the same and, more particularly, to a bendable display device and a method for fabricating the same.

Discussion of the Background

Display devices become more and more important as multimedia technology evolves. Accordingly, a variety of types of display devices such as liquid-crystal display (LCD) devices and organic light-emitting display (OLED) devices are currently used.

Recently, electronic devices with mobility are widely used. In addition to small electronic devices such as mobile phones, tablet PCs are widely used as mobile electronic devices.

Such mobile electronic devices include a display device for presenting visual information in the form of image or video to users in order to support a variety of features. As other components for driving a display device become smaller and smaller, the proportion of the display device in the electronic device has been gradually increasing. Accordingly, there is ongoing research to develop a structure of a display device that allows its elements to be bent at a certain angle.

The above information disclosed in this Background section is only for understanding of the background of the inventive concepts, and, therefore, it may contain information that does not constitute prior art.

SUMMARY

Applicant discovered that the design of bendable display devices typically result in bending stress and static electricity or electromagnetic noise that adversely affects the operation and/or reliability of the display device.

Display devices constructed according the principles and exemplary embodiments of the invention are capable of mitigating stress caused by bending.

Display devices constructed according the principles and exemplary embodiments of the invention also provide a display device that suppresses the adverse influence of static electricity or electromagnetic noise Additional features of the inventive concepts will be set forth in the description which follows, and in part will be apparent from the description, or may be learned by practice of the inventive concepts.

According to an aspect of the invention, a display device includes: a display panel having a display area and a non-display area, the non-display area being disposed at a peripheral portion of the display area and having a bending area; an integrated circuit (IC) disposed in the non-display area; a first layer formed between the display area and the IC and covering the bending area; and a first member covering the IC and the first layer and overlapping with the bending area.

The display device may further include: an output pad unit disposed on an outer side of the IC in the non-display area; and a flexible printed circuit board electrically connected to the output pad unit.

The display device may further include: a ground electrode disposed on the flexible printed circuit board, and the first member may be connected to the ground electrode to reduce interference from static electricity or electromagnetic waves in the non-display area.

The first member may include a first cover member having a first insulating layer, a conductive layer disposed on the first insulating layer, a second insulating layer disposed on the conductive layer, and may further include an opening exposing a part of the conductive layer through the first insulating layer, and the conductive layer may come in contact with the ground electrode via the opening.

The display device may further include: a polarization layer disposed on the display panel; a first adhesive layer disposed on the polarization layer; and a cover window disposed on the first adhesive layer.

A part of the first cover member may come in contact with the first adhesive layer.

A part of the first member may contact the first adhesive layer, a part of the first member is disposed between the first adhesive layer and the first layer, and the first layer and the first member abut the polarization layer.

The protective layer and the first cover member may come in contact with the polarization layer.

The display device might further include: a support panel disposed between the display area and the IC, and wherein the first layer comprises a protective layer and the first member comprises a first cover member. The IC may completely overlap with the first member.

The first member may include a first insulating layer, a conductive layer disposed on the first insulating layer, and a second insulating layer disposed on the conductive layer.

The first insulating layer may abut the IC.

The first insulating layer may include a first non-conductive adhesive layer, the conductive layer may include a conductive adhesive layer, and the second insulating layer may include a second non-conductive adhesive layer.

The display device may further include: a second member disposed on the display panel and overlapping with the bending area.

According to another aspect of the invention display device includes: a display panel having a display area and a non-display area, the non-display area being disposed at a peripheral portion of the display area and having a bending area; a integrated circuit (IC) disposed in the non-display area to drive the display panel; a first layer formed between the display area and the IC and covering the bending area; and a first member covering the IC and the protective layer and overlapping with the bending area, and comprises a conductive member to reduce interference from static electricity or electromagnetic waves in the non-display area.

The display device may further include: a ground electrode disposed on the flexible printed circuit board, wherein the conductive member is connected to the ground electrode.

According to yet another aspect of the invention, a method for manufacturing a display device includes the steps of: preparing a display panel having a display area and a non-display area, the non-display area being disposed at a peripheral portion of the display area and having an integrated circuit (IC) therein; forming a protective layer between the IC and the display area; forming a first member to cover the drive IC and the protective layer; and bending the display panel to form a bending area between the drive IC and the display area.

The method may further include disposing a second member on the display panel.

The method may further include the step of: connecting a flexible printed circuit board to the non-display area.

The first member may further include a first cover member that partially covers the flexible printed circuit board.

The method may further include the step of: forming a ground electrode on the flexible printed circuit board; and connecting the first cover member to the ground electrode.

The first cover member may include a first insulating layer, a conductive layer and a second insulating layer stacked on one another, and the step of connecting the first cover member to the ground electrode may include recessing the first insulating layer to form an opening via which the conductive layer is exposed, and electrically connecting a part of the conductive layer exposed via the opening with the ground electrode.

According to principles and exemplary embodiments of the invention, at least following effects can be achieved:

The bending area of the display panel can be protected.

The bending stress generated in the bending area due to the bending can be distributed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
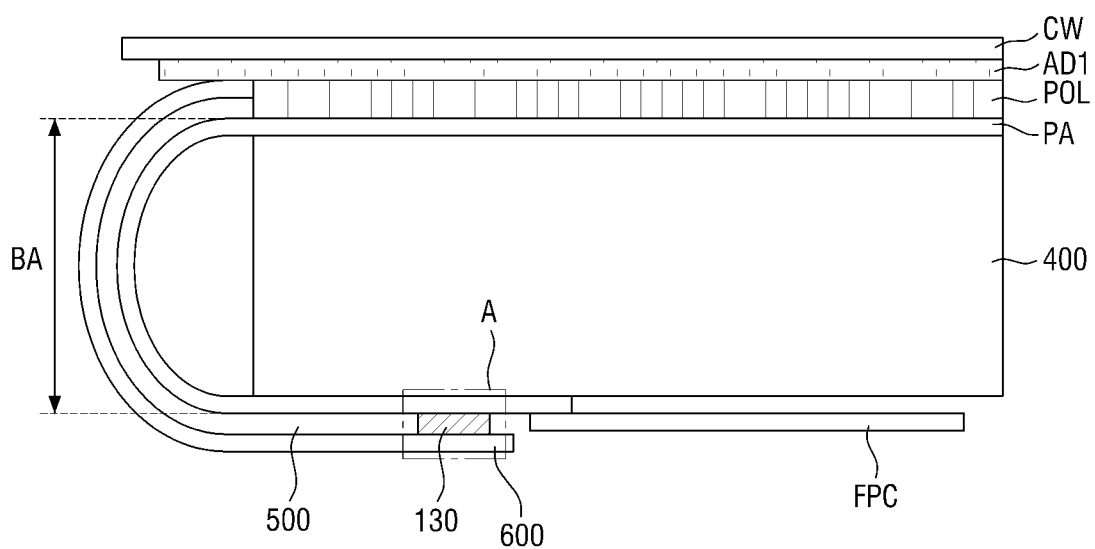
FIG. 1 is a cross-sectional view of a display device according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described in detail with reference to the accompanying drawings.

Figure 2:
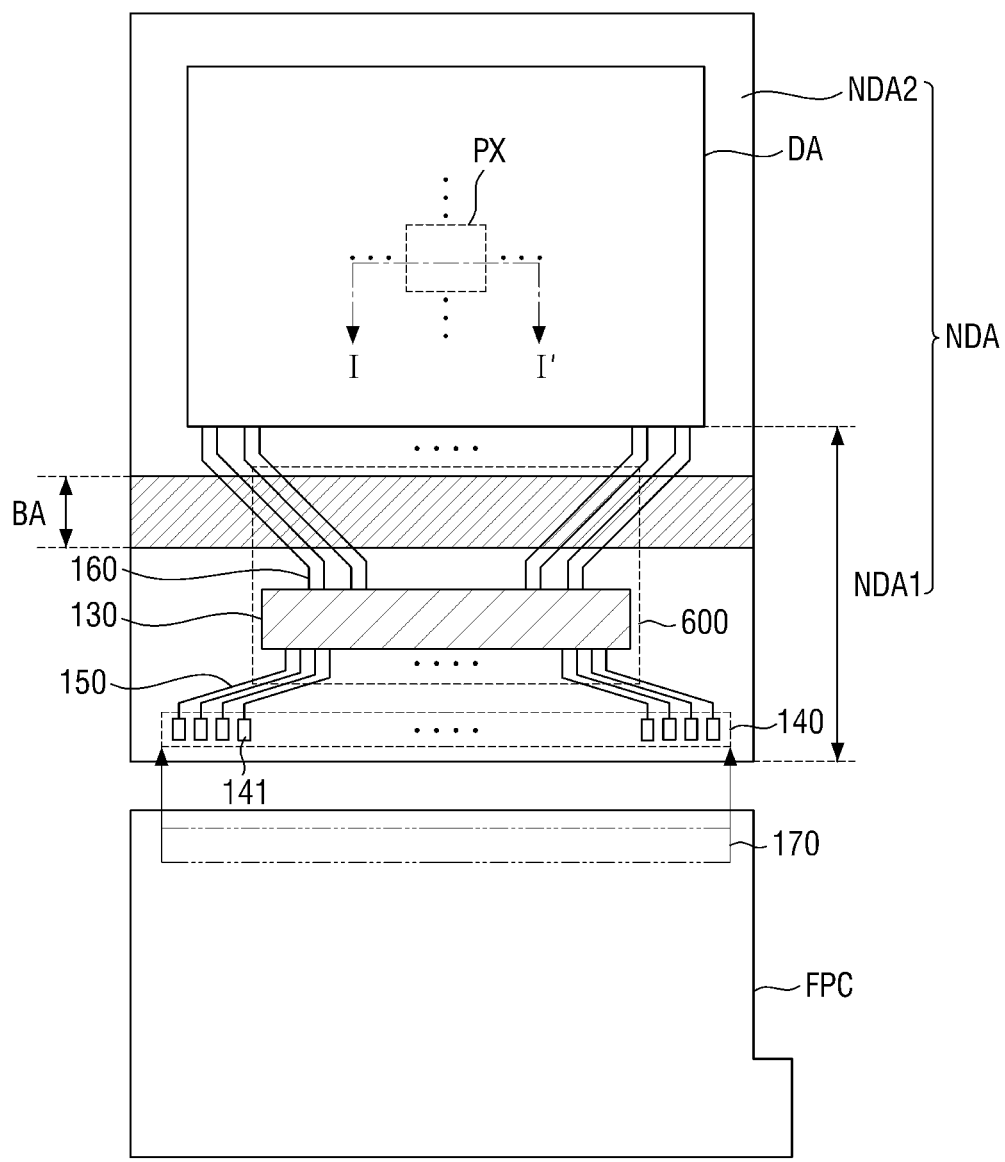
FIG. 2 is a view showing some elements of the display device according to the exemplary embodiment shown in FIG. 1.
Figure 3:
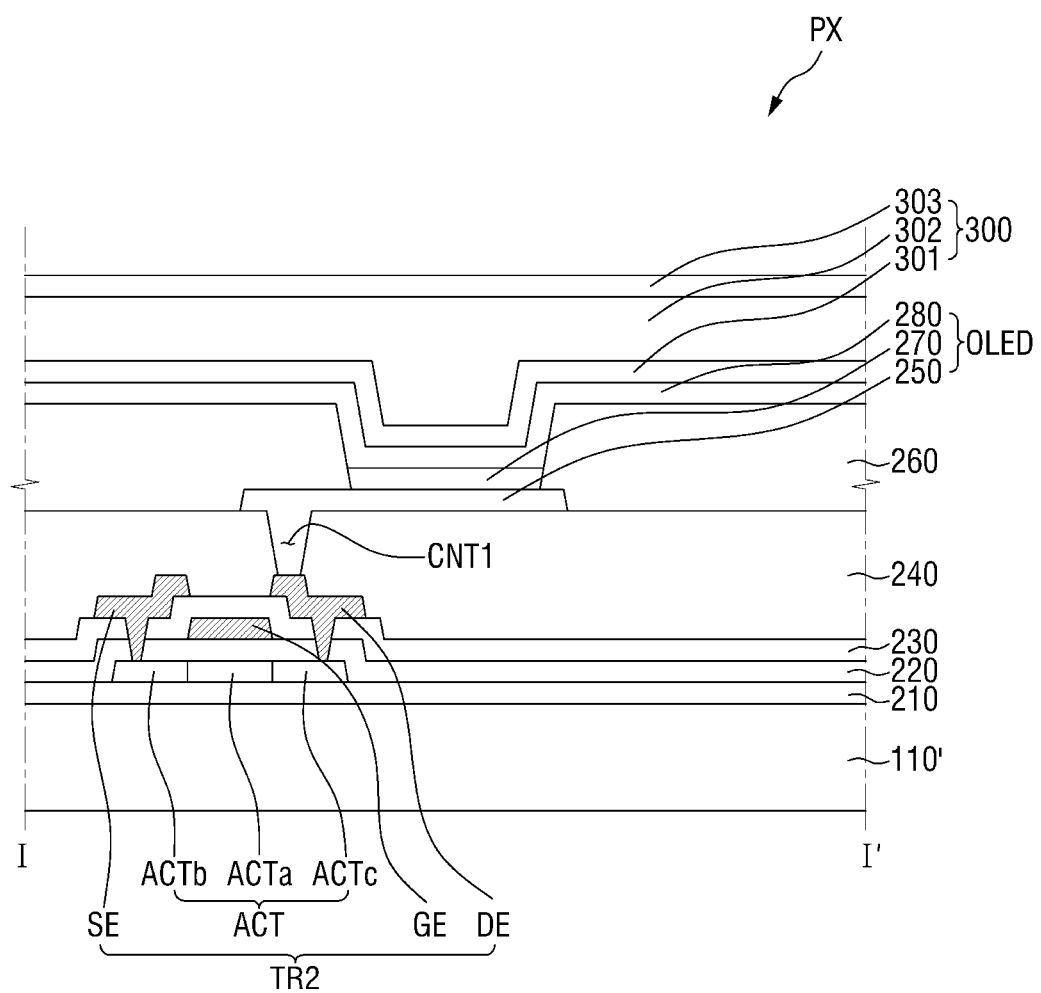
FIG. 3 is a cross-sectional view taken along line I-I' of FIG. 2.
Figure 4:
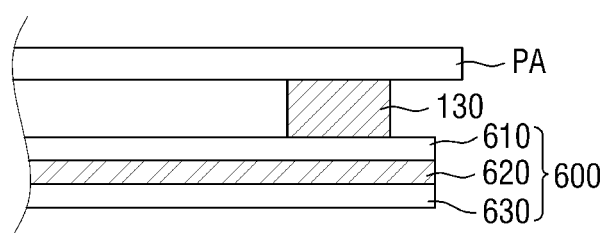
FIG. 4 is an enlarged view of portion A of FIG. 1.

FIG. 1 is a cross-sectional view of a display device according to an exemplary embodiment of the invention. FIG. 2 is a view showing some elements of the display device according to the exemplary embodiment shown in FIG. 1; FIG. 3 is a cross-sectional view taken along line I-I' of FIG. 2. FIG. 4 is an enlarged view of portion A of FIG. 1.

Referring to FIGS. 1 to 4, a display device according to an exemplary embodiment of the invention includes a display panel PA, a drive integrated circuit (IC) 130, a protective layer 500, and a first cover member 600.

The display device according to an exemplary embodiment of the invention may further include a support panel 400, a polarization layer POL, a first adhesive layer AD1, and a cover window CW.

Specifically, the display panel PA, the polarization layer POL, the first adhesive layer AD1, and the cover window CW may be sequentially stacked on the support panel 400 as shown in FIG. 1.

For convenience of illustration, the display panel PA will be described first, and then the other elements and the relationship among them will be described.

Referring to FIG. 2, a display area DA and a non-display area NDA may be defined on the display panel PA.

The display area DA may be defined as an area for displaying an image. A plurality of pixels PX for presenting an image may be disposed in the display area DA. The non-display area NDA is defined as an area that is disposed outside the display area DA and does not display an image. The non-display area NDA may surround the display area DA, for example. Although the non-display area NDA is shown as surrounding the display area DA in FIG. 2, this is merely illustrative. In another exemplary embodiment, the non-display area NDA may be disposed adjacent to only one side or the other side of the display area DA or may be disposed adjacent to either side of the display area DA separately.

In an exemplary embodiment, the non-display area NDA may include a first subsidiary non-display area NDA1 and a second subsidiary non-display area NDA2. The first subsidiary non-display area NDA1 is disposed adjacent to one side of the display area DA and may include a bending area BA described later. The second subsidiary non-display area NDA2 may refer to the rest of the non-display area other than the first subsidiary non-display area NDA1 and may not include the bending area BA. For convenience of illustration, FIG. 2 shows the display panel PA before it is bent.

The drive IC 130 and an output pad unit 140 may be disposed in the first subsidiary non-display area NDA1. The drive IC 130 may generate signals necessary for driving the display area DA and transmit them to the display area DA.

The drive IC 130 may be mounted directly on the display panel PA. That is to say, in the display device according to the exemplary embodiment of the invention, the drive IC 130 may be directly mounted on the display panel PA by using the chip-on-panel (COP) technique.

The drive IC 130 may generate scan signals and/or data signals based on the driving signal supplied from the output pad unit 140 and provide them to the pixels PX.

To this end, a plurality of input lines 150 may be disposed in the first subsidiary non-display area NDA1 to electrically connect the output pad unit 140 with the drive IC 130.

In addition, a plurality of output lines 160 for electrically connecting the drive IC 130 with the display area DA, especially, the plurality of pixels PX may be disposed in the first subsidiary non-display area NDA1.

In an exemplary embodiment, the drive IC 130 may be electrically connected to the plurality of input lines 150 and/or the plurality of output lines 160 by an anisotropic conductive film (ACF). That is to say, by interposing an anisotropic conductive film containing conductive particles between one end of the input lines 150 and/or the output lines 160 and the drive IC 130, the input lines 150 and/or the output lines 160 may be electrically connected to the drive IC 130.

It is, however, to be understood that the invention is not limited thereto. The input lines 150 and/or the output lines 160 may be electrically connected to the drive IC 130 in a variety of ways known in the art.

The output pad unit 140 may be disposed on one side of the first subsidiary non-display area NDA1. In an exemplary embodiment, the output pad unit 140 may be extended along the edge of the display panel PA.

The output pad unit 140 may include a plurality of output pads 141. The plurality of output pads 141 may be electrically connected to a flexible printed circuit board FPC.

According to an exemplary embodiment of the invention, the display device may further include a flexible printed circuit board FPC. In an exemplary embodiment, the flexible printed circuit board FPC is made of a flexible material and can be at least bent or rolled.

The flexible printed circuit board FPC can transmit signals necessary for driving to the output pad unit 140. To this end, a plurality of circuit patterns and a driving circuit may be formed on the flexible printed circuit board FPC.

The flexible printed circuit board FPC may include a substrate pad unit 170. A plurality of pads may be formed in the substrate pad unit 170.

The pads formed in the substrate pad unit 170 may be electrically connected to the output pads formed in output pad unit 140, respectively. Alternatively, one of the pads formed in the substrate pad unit 170 may be electrically connected to n pads formed in the output pad unit 140 or vice versa.

In an exemplary embodiment, the substrate pad unit 170 may be electrically connected to the output pad unit 140 by an anisotropic conductive film (ACF). Specifically, an anisotropic conductive film containing conductive particles may be interposed between the substrate pad unit 170 and the output pad unit 140 to electrically connect them.

It is, however, to be understood that the invention is not limited thereto. For example, in other implementations, the pads of the substrate pad unit 170 may be in contact with the pads of the output pad unit 140 to be electrically connected to thereto.

A bending area BA may be defined between the display area DA and the drive IC 130. The bending area BA is defined as a region where the display panel PA is bent to at least one curvature.

That is to say, the curvature of the front surface or rear surface of the display panel PA in the bending area BA may be larger than zero.

When the display panel PA is bent along the bending area BA, it may have the shape shown in FIG. 1. Accordingly, one end of the display panel PA may face the display area DA or the first subsidiary non-display area NDA1.

In addition, the drive IC 130 may overlap with the display area DA of the display panel PA.

The bending area BA may be made of a flexible material so that it can be is bent. Specifically, the first substrate 110, which is the base of the bending area BA, may be made of a flexible material.

In an exemplary embodiment, the entire first substrate 110 may be made of a flexible material or just the part of the first substrate 110 disposed in the bending area BA may be made of a flexible material.

The display area DA may include a plurality of pixels PX for displaying an image.

Hereinafter, the cross-sectional structure of a pixel PX will be described with reference to FIG. 3.

In an exemplary embodiment, the pixel PX may include a first substrate 110 and an organic light-emitting diode (OLED) formed on the first substrate 110.

The first substrate 110 may be an insulating substrate. In an exemplary embodiment, the first substrate 110 may include a material such as glass, quartz and a polymeric resin. The polymer material may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

In an exemplary embodiment, the first substrate 110 may be partially or entirely made of a flexible material. Accordingly, the first substrate 110 may be at least partially bent, rolled, or folded.

A buffer layer 210 may be disposed on the first substrate 110. The buffer layer 210 may provide a flat surface over the first substrate 110. In an exemplary embodiment, the buffer layer 210 may include one of a silicon nitride (SiNx) layer, a silicon oxide ($SiO_2$) layer, and a silicon oxynitride (SiOxNy) layer. The buffer layer 210 may be eliminated depending on the type of the first substrate 110, process conditions, etc.

The semiconductor layer including a semiconductor pattern ACT may be disposed on the buffer layer 210. The semiconductor pattern ACT will be described as an example of the semiconductor layer. In an exemplary embodiment, the semiconductor pattern ACT may be made of one selected from polycrystalline silicon, single crystal silicon, low-temperature polycrystalline silicon, amorphous silicon and oxide semiconductor or a mixture thereof. In an exemplary embodiment, the semiconductor pattern ACT may include a channel region ACTa doped with no impurity, and a source region ACTb and a drain region ACTc doped with impurities. The source region ACTb is located on one side of the channel region ACTa and is electrically connected to a source electrode SE described later. The drain region ACTc is located on the other side of the channel region ACTa and is electrically connected to a drain electrode DE described later.

The first pixel insulating layer 220 may be disposed on the semiconductor layer including the semiconductor pattern ACT. In an exemplary embodiment, the first pixel insulating layer 220 may be a gate insulating layer. In an exemplary embodiment, the first pixel insulating layer 220 may be made of at least one selected from the group consisting of: an inorganic insulating material such as silicon oxide (SiOx) and silicon nitride (SiNx), BCB (BenzoCycloButene), an acryl-based material and an organic insulating material such as polyimide, or a mixture thereof.

A gate conductor including the gate electrode GE may be disposed on the first pixel insulating layer 220. The gate electrode GE may overlap with the semiconductor pattern ACT. For example, the gate conductor may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

A second insulating layer 230 may be disposed on the gate conductor including the gate electrode GE. The second insulating layer 230 may be made of at least one selected from the group consisting of: an inorganic insulating material such as silicon oxide (SiOx) and silicon nitride (SiNx), BCB (BenzoCycloButene), an acryl-based material and an organic insulating material such as polyimide, or a mixture thereof.

A data conductor including the source electrode SE and the drain electrode DE may be disposed on the second insulating layer 230. The source electrode SE and the drain electrode DE are disposed on the second insulating layer 230 such that they are spaced apart from each other. The data conductor may include at least one selected from the group consisting of: a metal, an alloy, a metal nitride, a conductive metal oxide, and a transparent conductive material. In an exemplary embodiment, the data conductor may have a single-layer structure or a multi-layers structure made of nickel (Ni), cobalt (Co), titan (Ti), silver (Ag), copper (Cu), molybdenum (Mo), aluminum (Al), beryllium (Be), niobium (Nb), gold (Au), iron (Fe), selenium (Se), tantalum (Ta), etc. In addition, an alloy formed by adding at least one element selected from the group consisting of titanium (Ti), zirconium (Zr), tungsten (W), tantalum (Ta), niobium (Nb), platinum (Pt), hafnium (Hf), oxygen (O) and nitrogen (N) to the above-listed metal may be used as the materials of the source electrode SE and the drain electrode DE.

The semiconductor pattern ACT, the gate electrode GE, the source electrode SE and the drain electrode DE described above form a switching element TR2. Although the switching element TR2 is shown as a top-gate transistor in FIG. 3, the type of the switching element TR2 is not limited thereto. For example, the switching element TR2 may be a bottom-gate transistor.

A planarization layer 240 may be disposed on the data conductor. The planarization layer 240 can increase the luminous efficiency of the pixel electrode 250 and the organic emission layer 270, which will be described later, by removing the level difference. In an exemplary embodiment, the planarization layer 240 may include an organic material. For example, the planarization layer 240 may include at least one selected from the group consisting of polyimide, polyacryl, and polysiloxane. In another embodiment, the planarization layer 240 may be comprised of an inorganic material, or may be formed as a composite of an inorganic material and an organic material. A first contact hole CNT1 may be formed in the planarization layer 240 to expose at least a part of the drain electrode DE.

The pixel electrode 250 may be disposed on the planarization layer 240. The pixel electrode 250 may be electrically connected to the drain electrode DE exposed via the first contact hole CNT1. That is, the pixel electrode 250 may be an anode which is a hole injection electrode. When the pixel electrode 250 is an anode electrode, the pixel electrode 250 may include a material having a high work function to facilitate hole injection. In addition, the pixel electrode 250 may be a reflective electrode, a transflective electrode, or a transmissive electrode. In an exemplary embodiment, the pixel electrode 250 may include a reflective material. The reflective material may include, for example, at least one selected from the group consisting of: silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

The pixel electrode 250 may be formed as a single layer, for example. However, in other embodiments the pixel electrode 250 may be made up of multiple-layers in which two or more materials are stacked.

When the pixel electrode 250 is made up of multiple layers, the pixel electrode 250 may include, for example, a reflective layer and a transparent or translucent electrode disposed on the reflective layer. For another example, the pixel electrode 250 may include a reflective layer and a transparent or translucent electrode disposed under the reflective layer. For example, the pixel electrode 250 may have, but is not limited to, a three-layer structure of ITO/Ag/ITO.

The transparent or transflective electrode may be made of at least one selected from the group consisting of: indium tin oxide (ITO), indium zinc oxide (IZO), zinc oxide (ZnO), $In_2O_3$ (Indium Oxide), indium gallium oxide (IGO), and aluminum zinc oxide (AZO).

A pixel defining layer 260 may be disposed on the pixel electrode 250. The pixel defining layer 260 includes an opening exposing at least a part of the pixel electrode 250. The 260 may include an organic material or an inorganic material. For example, the 260 may include a material such as a photoresist, a polyimide resin, an acrylic resin, a silicon compound and a polyacrylic resin.

The organic emission layer 270 may be disposed on the pixel electrode 250 and the pixel defining layer 260. More specifically, the organic emission layer 270 may be disposed on the portion of the pixel electrode 250 that is exposed via the opening of the pixel defining layer 260. In an exemplary embodiment, the organic emission layer 270 may cover at least a part of the sidewall of the pixel defining layer 260.

In an exemplary embodiment, the organic emission layer 270 may emit one of red, blue and green colors, for example. In another embodiment, the organic emission layer 270 may emit white light or emit light of one of cyan, magenta and yellow. When the organic emission layer 270 emits white light, it may include a white light-emitting material, or may have a stacked structure of a red light-emitting layer, a green light-emitting layer and a blue light-emitting layer to emit white light.

The common electrode 280 may be disposed on the organic emission layer 270 and the pixel defining layer 260. In an exemplary embodiment, the common electrode 280 may be disposed throughout the organic emission layer 270 and the pixel defining layer 260. In an exemplary embodiment, the common electrode 280 may be a cathode electrode. In an exemplary embodiment, the common electrode 280 may include at least one selected from the group consisting of: Li, Ca, LiF/Ca, LiF/Al, Al, Ag and Mg. In addition, the common electrode 280 may be made of a material having a low work function. In an exemplary embodiment, the common electrode 280 may be made of at least one selected from the group consisting of: indium tin oxide (ITO), indium zinc oxide (IZO), zinc oxide (ZnO), indium oxide ($In_2O_3$), indium gallium oxide (IGO), and aluminum zinc oxide (AZO).

The above-described pixel electrode 250, organic emission layer 270 and common electrode 280 may constitute the organic light-emitting diode OLED. However, this is merely illustrative. The organic light-emitting diode OLED may have a multiple layer structure further including a hole injection layer (HIL), a hole transport layer (HTL), an electron transport layer (ETL), and an electron injection layer (EIL).

An encapsulation layer 300 may be disposed on the common electrode CE. The encapsulation layer 300 can prevent moisture and air, which may flow from the outside, from permeating into the organic light-emitting diode OLED. In an exemplary embodiment, the encapsulation layer 300 may include a first inorganic layer 301, an organic layer 302, and a second inorganic layer 303.

The first inorganic layer 301 may be disposed on the common electrode 280. The first inorganic layer 301 may include at least one selected from the group consisting of silicon oxide (SiOx), silicon nitride (SiNx), and silicon oxynitride (SiONx).

The organic layer 302 may be disposed on the first inorganic layer 301. The organic layer 302 may include one selected from the group consisting of epoxy, acrylate, and urethane acrylate. The organic layer 302 can provide a flat surface over the level difference created by the pixel defining layer 260.

The second inorganic layer 303 may be disposed on the organic layer 302. The second inorganic layer 303 may include at least one selected from the group consisting of silicon oxide (SiOx), silicon nitride (SiNx), and silicon oxynitride (SiONx).

Although each of the first inorganic layer 301, the organic layer 302 and the second inorganic layer 303 shown in FIG. 3 is made up of a single layer, this is merely illustrative. That is to say, at least one of the first inorganic layer 301, the organic layer 302 and the second inorganic layer 303 may be made up of multiple layers.

In another exemplary embodiment, the encapsulation layer 300 may include a hexamethyldisiloxane (HMDSO) layer. More specifically, the encapsulation layer 300 may include the first inorganic layer 301, the second inorganic layer 303 and the HMDSO layer disposed between the first inorganic layer 301 and the second inorganic layer 303. That is, the above-described organic layer 302 may be replaced with the HMDSO layer.

In an exemplary embodiment, the HMDSO layer may be formed in the same chamber after forming the first inorganic layer 301. By doing so, the process of forming the encapsulation layer 300 can become simpler. In addition, as the encapsulation layer 300 includes the HMDSO layer that is capable of absorbing stress, the encapsulation layer 300 can have sufficient flexibility.

In an exemplary embodiment, a touch sensing layer for sensing an input may be additionally disposed on the encapsulation layer 300.

Referring back to FIG. 1, a polarization layer POL may be disposed on the front surface of the display panel PA. The polarization layer POL can reduce the reflectance of external light incident from the outside. In an exemplary embodiment, the polarization layer POL may include a retarder and a polarizer.

The polarization layer POL may completely cover the display area DA of the display panel PA. To do so, the area of the polarization layer POL may be equal to or larger than the area of the display area DA when viewed from the top.

In other implementations, the polarization layer POL may be eliminated. When the polarization layer POL is eliminated, a black matrix and/or a color filter may be disposed on the display panel PA in order to prevent color separation due to external light reflection.

The first adhesive layer AD1 may be disposed on the polarization layer POL. In an exemplary embodiment, the first adhesive layer AD1 may have optical transparency to transmit an image generated in the display panel PA. To this end, the first adhesive layer AD1 may include an optically clear adhesive (OCA).

The cover window CW may be disposed on the first adhesive layer AD1. In an exemplary embodiment, the cover window CW may be made of transparent glass or plastic. That is to say, the cover window W may be formed of a light-transmitting material. Accordingly, the image generated in the display panel PA can be presented to the user through the cover window W.

A support panel 400 may be disposed on the rear surface of the display panel PA. The support panel 400 may have a substantially plate-like shape and can support the display panel PA.

In an exemplary embodiment, the support panel 400 may be made of plastic or rubber. It is, however, to be understood that the invention is not limited thereto. For example, the support panel 400 may be made of a mixture of plastic and rubber or may include other polymer materials. That is to say, the support panel 400 may be made of an elastic material to mitigate and dampen the effects of an impact applied to the display panel PA.

As described above, when the display panel PA is bent along the bending area BA, the support panel 400 may be disposed between the drive IC 130 and the display area DA.

Referring to FIGS. 1 and 2, the protective layer 500 may be disposed in the first subsidiary non-display area NDA1.

The protective layer 500 may cover the bending area BA disposed in the first subsidiary non-display area NDA1. In an exemplary embodiment, the protective layer 500 may entirely or partially cover the area between the drive IC 130 and the display area DA.

The protective layer 500 may protect the bending area BA of the display panel PA. That is to say, if a stress, such as an external impact, is applied to the bending area BA of the display panel PA when it is bent, the bending area BA may become vulnerable and/or damages due to the impact stress thus generated. For this reason, by forming the protective layer 500 to cover the bending area BA, the external impact applied to the bending area BA can be mitigated or prevented.

The protective layer 500 may be bent along the bending area BA. To this end, the protective layer 500 may be formed of a flexible polymer material. The flexible polymer material may include, for example, resin.

The protective layer 500 may be bent together with the display panel PA along the bending area BA. Accordingly, the protective layer 500 can partially distribute the bending stress applied to the bending area BA.

In an exemplary embodiment, one end of the protective layer 500 may extend to a portion where the drive IC 130 is disposed. Accordingly, the end of the protective layer 500 may come in contact with the drive IC 130. In another exemplary embodiment, the end of the protective layer 500 may extend to the vicinity of the drive IC 130, but may not be in contact with the drive IC 130.

In addition, the protective layer 500 may not cover the drive IC 130 in either case.

In an exemplary embodiment, the protective layer 500 may not cover the display area DA.

Further, in an exemplary embodiment, the opposite end of the protective layer 500 may not overlap with the polarization layer POL. That is to say, the protective layer 500 may be formed only in a region where the polarization layer POL covering the display area DA is not formed.

In addition, the opposite end of the protective layer 500 may extend to the region where the polarization layer POL is disposed, and may come in contact with by abutting the end the polarization layer POL.

Referring to FIG. 2, the first cover member 600 may be disposed such that it covers the drive IC 130 and the protective layer 500.

The first cover member 600 may completely cover the drive IC 130 as shown in FIG. 2. That is to say, the drive IC 130 may be completely overlapped with the first cover member 600.

Since the first cover member 600 completely covers the drive IC 130, the first cover member 600 can prevent the drive IC 130 from being contaminated by foreign substances. In addition, by covering the drive IC 130 with the first cover member 600, it is possible to prevent the drive IC 130 from being directly exposed to an external impact.

Since the first cover member 600 completely covers the drive IC 130, one end of the first cover member 600 may be disposed under the support panel 400. More specifically, one end of the first cover member 600 may be disposed between the drive IC 130 and the output pad unit 140. It is, however, to be understood that the invention is not limited thereto. In another exemplary embodiment, the first cover member 600 may further extend to the flexible printed circuit board FPC to cover the output pad unit 140 and at least a part of the flexible printed circuit board FPC.

In an exemplary embodiment, the first cover member 600 may cover the protective layer 500. Accordingly, the first cover member 600 may be overlapped with the bending area BA. In addition, the opposite end of the first cover member 600 may extend to the area where the polarization layer POL is disposed. Accordingly, in an exemplary embodiment, the opposite end of the first cover member 600 may come in contact with and abut end of the polarization layer POL.

In an exemplary embodiment, the opposite end of the first cover member 600 and the opposite end of the protective layer 500 may be aligned with each other. Accordingly, the opposite end of the first cover member 600 and the opposite end of the protective layer 500 may come in contact with and abut the end of the polarization layer POL.

When the opposite end of the first cover member 600 extends to the polarization layer POL, a part of the first cover member 600 may come in contact with the first adhesive layer AD1. Accordingly, the opposite end of the first cover member 600 may be interposed between the protective layer 500 and the cover window CW. That is to say, the opposite end of the first cover member 600 may be fixed by the first adhesive layer AD1 attaching the cover window CW to the polarization layer POL. The first cover member 600 may be bent along the bending area BA as shown in FIG. 1, with the opposite end is fixed by the first adhesive layer AD1.

As described above, the bending area BA is relatively vulnerable to impact while it is bent. When the first cover member 600 completely covers the bending area BA, it is possible to mitigate or prevent the external impact generated during the process from being transmitted to the bending area BA.

Next, the structure of the first cover member 600 will be described in detail with reference to FIG. 4.

Referring to FIG. 4, the first cover member 600 may include a first insulating layer 610, a conductive layer 620, and a second insulating layer 630 which are sequentially stacked on one another.

The first insulating layer 610 covers, and may directly contact an outer surface of, the drive IC 130.

If the conductive layer 620 comes in contact with the drive IC 130, noise may interfere with the signals generated in the drive IC 130. For this reason, the drive IC 130 can be completely insulated from the conductive layer 620 by the first insulating layer 610.

The first insulating layer 610 may be made of an organic insulating material. The organic insulating material may be, for example, polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

The conductive layer 620 may be disposed on the first insulating layer 610. The conductive layer 620 may be made up of a metal or a polymer material having electrical conductivity. For example, the metal may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta). It is, however, to be understood that the type of the metal is not limited thereto. Any metal may be used as the material of the conductive layer 620 as long as it has electrical conductivity.

The second insulating layer 630 may be disposed on the conductive layer 620.

The second insulating layer 630 may completely cover the conductive layer 620. Accordingly, the first insulating layer 610 and the second insulating layer 630 may be disposed such that they cover the rear surface and the front surface of the conductive layer 620, respectively. That is to say, the front surface and the rear surface of the conductive layer 620 may not be exposed to the outside by the first insulating layer 610 and the second insulating layer 630.

The conductive layer 620 may guide static electricity generated irregularly according to the transfer of various signals in the non-display area NDA. Specifically, undesirable static electricity may be generated in the drive IC 130 or various wirings disposed in the non-display area NDA as signals are transferred. Such static electricity may affect the drive IC 130 or the adjacent wiring, resulting in signal interference.

In this regard, when the first cover member 600 includes the conductive layer 620 as described above, irregular static electricity generated at random locations in the non-display area NDA can be guided away and/or dispersed by the conductive layer 620. As a result, it is possible to prevent the static electricity from adversely affecting the flow of signals or the electrical characteristics of each wiring.

In addition, since a large number of wirings are densely arranged in the narrow, non-display area NDA, electromagnetic noise may occur. When the first cover member 600 includes the conductive layer 620 as described above, by guiding and/or dispersing the undesirable electromagnetic noise generated along the conductive layer 620, it is possible to prevent the electromagnetic noise from adversely affecting the wireless communications.

Hereinafter, a display device according to another exemplary embodiment of the invention will be described. Some of elements described below may be identical to those of the display device according to the above-described exemplary embodiment of the invention; and, therefore, description thereof may be omitted to avoid redundancy.

Figure 5:
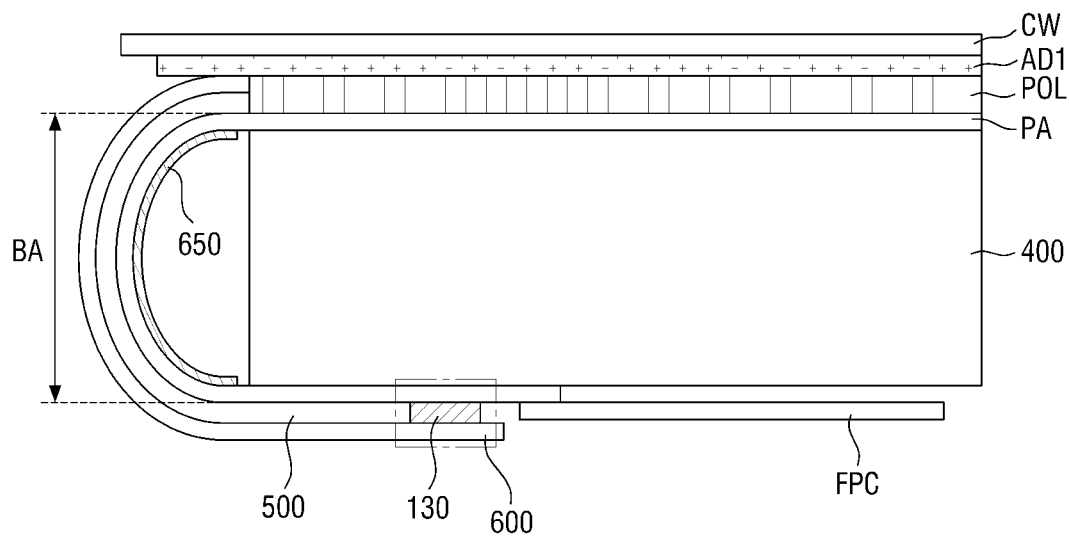
FIG. 5 is a cross-sectional view of a display device according to an exemplary embodiment of the invention.

FIG. 5 is a cross-sectional view of a display device according to an exemplary embodiment of the invention.

Referring to FIG. 5, a display device according to the exemplary embodiment of the invention may further include a second cover member 650.

In an exemplary embodiment, the second cover member 650 may be disposed on the rear surface of the display panel PA. That is to say, unlike the first cover member 600 disposed on the front surface, the second cover member 650 may be disposed on the rear surface of the display panel PA.

The second cover member 650 may overlap with the bending area BA. Accordingly, the bending area BA may be interposed between the first cover member 600 and the second cover member 650.

The second cover member 650 may be disposed on the rear surface of the display panel PA and may be bent along the bending area BA. When the second cover member 650 is bent along the bending area BA, the second cover member 650 may support the bending of the display panel PA at the rear surface of the display panel PA.

Accordingly, the second cover member 650 can mitigate or block the effects of an external impact applied to the bending area BA at the rear surface of the display panel PA. In addition, as the second cover member 650 is bent together with the bending area BA, the bending stress applied to the bending area BA can be distributed, so that it is possible to prevent the elements disposed in the bending area BA from being fatigued, damaged and/or broken.

In an exemplary embodiment, the second cover member 650 may be made of the same material as the first cover member 600. That is to say, as described above with reference to FIG. 4, the second cover member 650 may have a stacked structure in which the first insulating layer 610, the conductive layer 620, and the second insulating layer 630 are sequentially stacked on one another.

Figure 6:
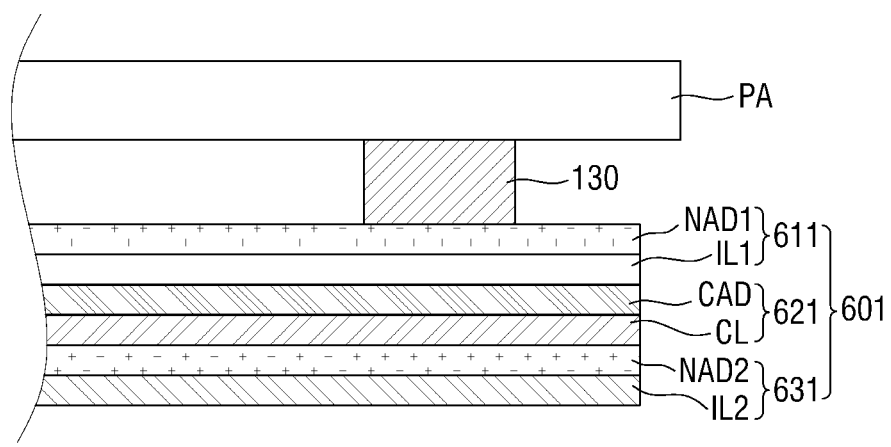
FIG. 6 is a cross-sectional view of a display device according to an exemplary embodiment of the invention.

FIG. 6 is a cross-sectional view of a display device according to an exemplary embodiment of the invention.

Referring to FIG. 6, in an exemplary embodiment, a first cover member 601 may include a first insulating layer 611, a conductive layer 621, and a second insulating layer 631 which are sequentially stacked on one another.

In an exemplary embodiment, the first insulating layer 611 may include a first non-conductive adhesive layer NAD1 and a first sub-insulating layer IL1.

The first non-conductive adhesive layer NAD1 may be made of a non-conductive material which has an adhesive property and does not conduct electricity. In an exemplary embodiment, the first non-conductive adhesive layer NAD1 may be made of a material including a photocurable resin or a thermosetting resin having a high transmittance and adhesive property.

Accordingly, the first non-conductive adhesive layer NAD1 may come in contact with and attached to the drive IC 130.

In addition, the first non-conductive adhesive layer NAD1 may come in contact with or attached to a part of the protective layer 500.

In an exemplary embodiment, a first sub-insulating layer IL1 may be formed of an organic insulating material. The organic insulating material may include one or more selected from the group consisting of: polyethylene terephthalate (PET), polyethylene naphthalate (PEN), polyethylene sulfide (PES), and polyethylene (PE).

It is to be noted that the material of the first sub-insulating layer IL1 is not limited thereto.

The conductive layer 621 may be disposed on the first sub-insulating layer IL1. In an exemplary embodiment, the conductive layer 621 may include a conductive adhesive layer CAD and a sub-conductive layer CL.

The conductive adhesive layer CAD may have electrical conductivity and an adhesive property. To this end, the conductive adhesive layer CAD may be formed by mixing a metal or a conductive polymer with a resin having adhesive property. Accordingly, the conductive layer 621 may be attached to the first insulating layer 611 by the conductive adhesive layer CAD.

The conductive layer 621 may be disposed on the conductive adhesive layer CAD.

The conductive layer 621 may be made up of a metal or a polymer material having electrical conductivity. For example, the metal may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta). It is, however, to be understood that the type of the metal is not limited thereto. Any metal may be used as the material of the conductive layer 621 as long as it has electrical conductivity.

The second insulating layer 631 may be disposed on the conductive layer 621.

In an exemplary embodiment, the second insulating layer 631 may include a second non-conductive adhesive layer NAD2 and a second sub-insulating layer IL2. In an exemplary embodiment, the second non-conductive adhesive layer NAD2 may be made of a non-conductive material which has adhesive property and does not conduct electricity. In an exemplary embodiment, the second non-conductive adhesive layer NAD2 may be made of a material including a photocurable resin or a thermosetting resin having a high transmittance and adhesive property.

The second insulating layer 631 may be attached to the conductive layer 621 by the second non-conductive adhesive layer NCAD.

The second sub-insulating layer IL2 may be disposed on the second non-conductive adhesive layer NAD2. In an exemplary embodiment, the second sub-insulating layer IL2 may be formed of an organic insulating material. The organic insulating material may include one or more selected from the group consisting of: polyethylene terephthalate (PET), polyethylene naphthalate (PEN), polyethylene sulfide (PES), and polyethylene (PE).

It is to be noted that the material of the second sub-insulating layer IL2 is not limited thereto.

Figure 7:
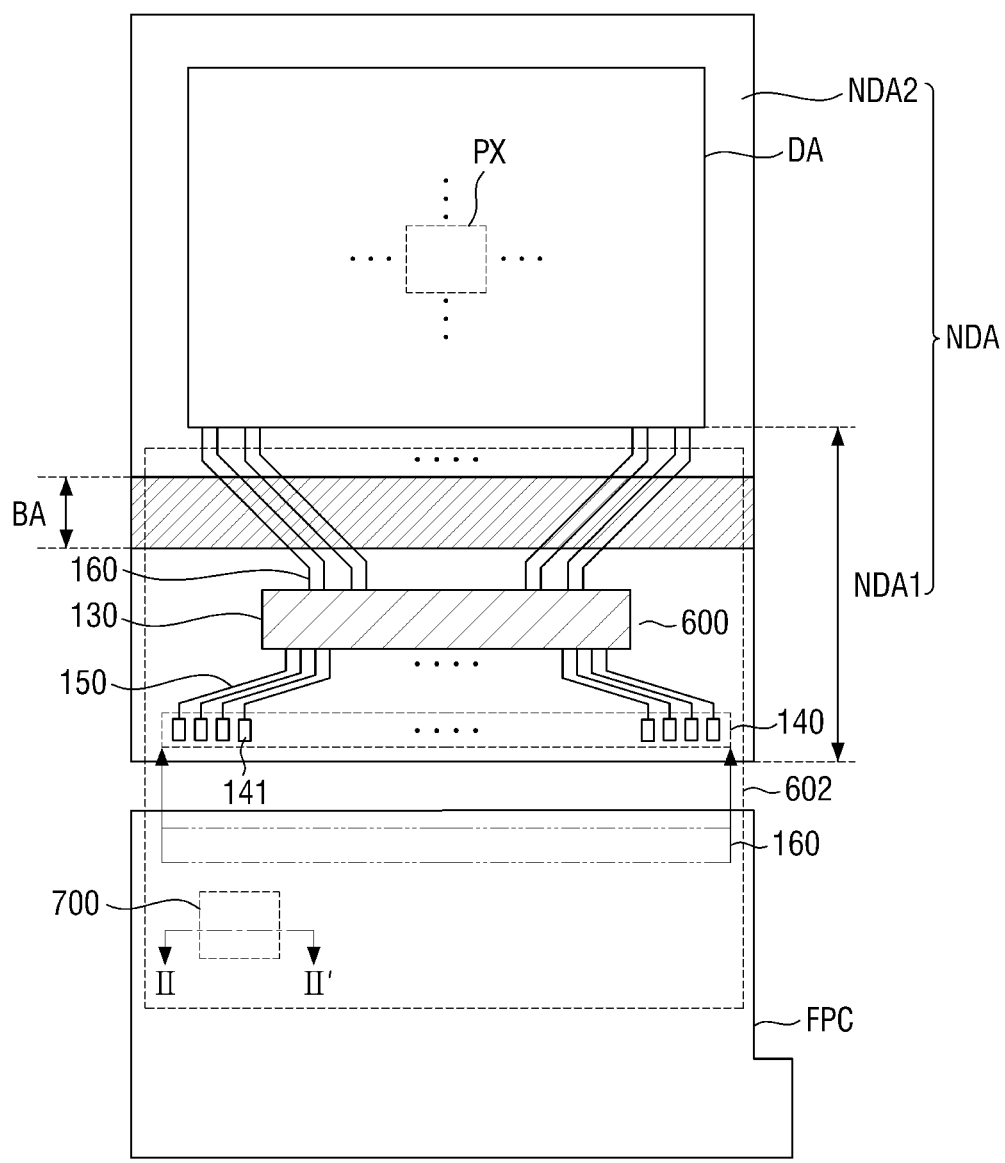
FIG. 7 is a view showing a display device according to another exemplary embodiment of the invention.
Figure 8:
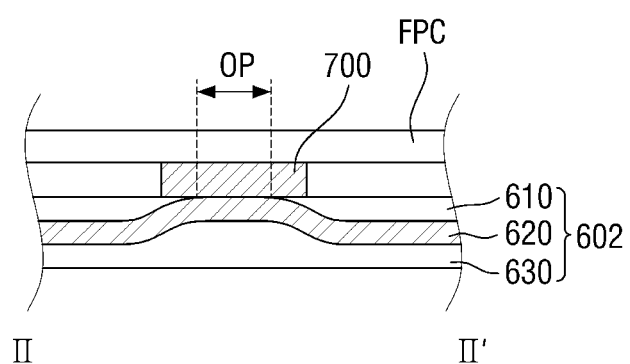
FIG. 8 is a cross-sectional view taken along line II-II' of FIG. 7.

FIG. 7 is a view showing a display device according to another exemplary embodiment of the invention. FIG. 8 is a cross-sectional view taken along line II-II' of FIG. 7.

Referring to FIGS. 7 and 8, a display device according to an exemplary embodiment of the invention may further include a flexible printed circuit board FPC and a ground electrode 700 disposed on the flexible printed circuit board FPC.

In an exemplary embodiment, one end of a first cover member 602 may extend further toward the flexible printed circuit board FPC. Accordingly, the first cover member 602 may cover an output pad unit 140 and at least a part of the flexible printed circuit board FPC, in addition to a drive IC 130.

In an exemplary embodiment, at least one ground electrode 700 may be formed on the flexible printed circuit board FPC. The ground electrode 700 may be disposed in an island-type shape at a position on the flexible printed circuit board FPC.

In an exemplary embodiment, a conductive layer 620 of the first cover member 602 may be electrically connected to the ground electrode 700. That is to say, the conductive layer 620 of the first cover member 602 may be connected to the ground electrode 700, to be connected to the ground potential.

Referring to FIG. 8, the first cover member 602 may include an opening OP via which a part of the conductive layer 620 is exposed to electrically connect the conductive layer 620 with the ground electrode 700. The opening OP may be formed by recessing the first insulating layer 610 so that a part of the upper surface of the conductive layer 620 is exposed.

Accordingly, the ground electrode 700 may come in contact with and electrically connected to the conductive layer 620 via the opening OP.

Although FIG. 8 illustrates the example where the ground electrode 700 and the conductive layer 620 are in direct contact with each other and electrically connected to each other, they may be electrically connected to each other in other ways. For example, in another exemplary embodiment, an element having electrical conductivity may be interposed between the ground electrode 700 and the conductive layer 620 to electrically connect them.

When the conductive layer 620 is connected to the ground electrode 700, static electricity or electromagnetic waves generated in the non-display area NDA may be guided toward the ground electrode 700 through the conductive layer 620. As a result, it is possible to prevent static electricity or electromagnetic waves from interfering with signals or adversely affecting the electrical characteristics of adjacent wirings.

Figure 9:
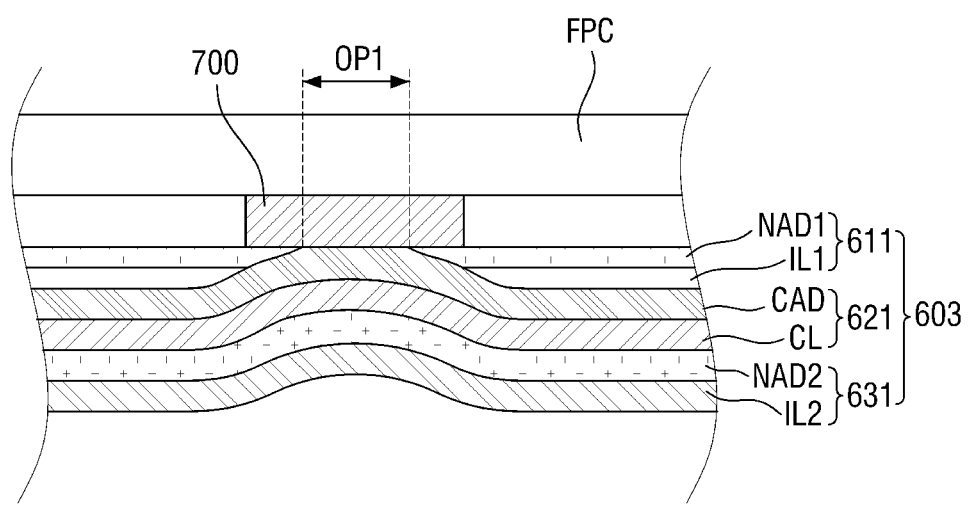
FIG. 9 is a cross-sectional view of a part of a display device according to another exemplary embodiment of the invention.

FIG. 9 is a cross-sectional view of a part of a display device according to another exemplary embodiment of the invention. As described above with reference to FIG. 6, a first cover member 603 may include a first non-conductive adhesive layer NAD1, a first sub-insulating layer ILL a conductive adhesive layer CAD, a sub-conductive layer CL, a second non-conductive adhesive layer NAD2, and a second sub-insulating layer IL2. According to this exemplary embodiment, the first cover member 603 may be extended toward the flexible printed circuit board FPC and be grounded to the ground electrode 700.

To this end, the first cover member 603 may include an opening OP1 via which a part of a conductive adhesive layer CAD is exposed. The opening OP1 may be formed by recessing the first non-conductive adhesive layer NAD1 and the first sub-insulating layer IL1 so that a part of the upper surface of the conductive adhesive layer CAD is exposed. Accordingly, the conductive adhesive layer CAD may come in contact with the ground electrode 700 so that the conductive layer 621 may be connected to the ground potential.

The same effects can be achieved as those described above with reference to FIG. 8.

Hereinafter, a method for manufacturing a display device according to an exemplary embodiment of the invention will be described.

According to an exemplary embodiment of the invention, a method for manufacturing a display device includes: preparing a display panel PA having a display area DA and a non-display area NDA defined thereon, the non-display area NDA being disposed on an outer side of the display area DA and including a drive integrated circuit (IC) 130 therein; forming a protective layer between the drive IC 130 and the display area DA; forming a first cover member 600 to cover the drive IC 130 and the protective layer 500; and bending the display panel PA to form a bending area BA between the drive IC 130 and the display area DA.

Initially, the method may include preparing a display panel PA having a display area DA and a non-display area NDA defined thereon, the non-display area disposed on the outer side of the display area DA and comprising a drive IC 130 disposed in the non-display area NDA. The display panel PA may be substantially identical to the display panel PA described above with reference to FIG. 2.

That is to say, a plurality of pixels PX may be arranged in the display area DA of the display panel PA. In addition, the non-display area NDA of the display panel PA may include the first subsidiary non-display area NDA1 including the bending area BA (FIG. 2 shows the bending area BA before the display panel PA is bent) and the second subsidiary non-display area NDA2.

The drive IC 130 may be directly mounted on the first subsidiary non-display area NDA1.

A plurality of output lines 160 may be disposed between the drive IC 130 and the display area DA. An output pad unit 140 may be disposed at one end of the first subsidiary non-display area NDA1, i.e., on the outer side of the drive IC 130. A plurality of input lines 150 may be disposed between the output pad unit 140 and the drive IC 130.

The method for manufacturing a display device according to an exemplary embodiment of the invention may further include forming a polarization layer POL on the display panel PA. The polarization layer POL may be formed to completely cover the display area DA. The order of forming the polarization layer POL is not particularly limited herein. In an exemplary embodiment, the polarization POL may be formed before or after the protective layer 500 is formed. In other implementations, the polarization layer POL may be formed after the bending step.

Subsequently, the method may include forming a protective layer 500 between the drive IC 130 and the display area DA.

The forming the protective layer 500 may include applying a resin between the drive IC 130 and the display area DA and curing the resin.

The protective layer 500 may be formed to cover a bending area BA to be formed in a process described later.

In an exemplary embodiment, the protective layer 500 may come in contact with the drive IC 130. It is to be noted that, even thought the protective layer 500 is in contact with the drive IC 130, it may not cover the upper surface of the drive IC 130.

Subsequently, the method may include forming the first cover member 600 covering the drive IC 130 and the protective layer 500.

The first cover member 600 may be substantially identical to that of any of those described in connection with display devices constructed according to the exemplary embodiments of the invention.

The first cover member 600 may completely cover the upper surface of the drive IC 130. In addition, the first cover member 600 may cover the protective layer 500 and may cover the bending area BA to be formed in a subsequent process. In addition, the opposite end of the first cover member 600 may be extended to the vicinity of the display area DA.

Subsequently, the method may include bending the display panel PA to form the bending area BA between the drive IC 130 and the display area DA. As shown in FIGS. 1 and 2, by bending the display panel PA, the bending area BA may be formed. As described above, the bending area BA may be defined as an area having a curvature greater than zero at the front or rear surface.

Since the protective layer 500 and the first cover member 600 thus formed overlap with the bending area BA, the protective layer 500 and the first cover member 600 may be bent along the bending area BA at the bending step. Accordingly, the protective layer 500 and the first cover member 600 can mitigate the bending stress applied to the bending area BA. FIG. 1 shows the display panel when it is bent. The protective layer 500 and the first cover member 600 can protect the bending area BA when it is bent, as described above.

A method for manufacturing a display device according to another exemplary embodiment of the invention may further include forming a second cover member 650 on the rear surface of the display panel PA before the bending step.

The second cover member 650 may be disposed on the rear surface of the display panel PA as shown in FIG. 5. When the second cover member 650 is attached to the rear surface of the display panel PA, the first cover member 600, the second cover member 650, and the protective layer 500 may be bent along the bending area in the bending step. Accordingly, the first cover member 600, the second cover member 650 and the protective layer 500 may mitigate the bending stress applied to the bending area BA.

In another exemplary embodiment, the method may further include electrically connecting a flexible printed circuit board FPC to the non-display area NDA. In an exemplary embodiment, the electrically connecting the flexible printed circuit board FPC may be performed prior to the forming the first cover member 600.

In an exemplary embodiment, the forming the first cover member 600 after the flexible printed circuit board FPC is formed may include forming the first cover member 600 so that it covers the output pad unit 140 and a part of the flexible printed circuit board FPC.

In an exemplary embodiment, a ground electrode 700 may be disposed on the flexible printed circuit board FPC (see FIG. 7).

According to this exemplary embodiment, the method may further include connecting the first cover member 600 to the ground electrode 700.

The step of connecting the first cover member 600 to the ground electrode 700 may include recessing a first insulating layer 610 of the first cover member 600 in which the first insulating layer 610, a conductive layer 620 and a second insulating layer 630 are sequentially stacked on one another to form an opening OP via which the conductive layer 620 is exposed, and electrically connecting the conductive layer exposed via the opening OP with the ground electrode 700 (see FIGS. 8 and 9 for more detailed description).

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a display area and a non-display area, the non-display area being disposed at a peripheral portion of the display area and having a bending area;
   an integrated circuit (IC) disposed in the non-display area to drive the display panel;
   an output pad unit disposed on an outer side of the IC in the non-display area;
   a flexible printed circuit board electrically connected to the output pad unit; and
   a first member covering the IC and completely overlapping the IC in a plan view,
   wherein the first member directly contacts only one surface of the IC which is opposite the display panel.

2. A display device comprising:
   a display panel having a display area and a non-display area, the non-display area being disposed at a peripheral portion of the display area and having a bending area;
   an integrated circuit (IC) disposed in the non-display area to drive the display panel;
   an output pad unit disposed on an outer side of the IC in the non-display area;
   a flexible printed circuit board electrically connected to the output pad unit;
   a first member covering the IC; and
   a ground electrode disposed on the flexible printed circuit board,
   wherein the first member is connected to the ground electrode to reduce interference from static electricity or electromagnetic waves in the non-display area.

3. The display device of claim 2, wherein:
   the first member comprises a first cover member having a first insulating layer, a conductive layer disposed on the first insulating layer, a second insulating layer disposed on the conductive layer, and an opening exposing a part of the conductive layer through the first insulating layer; and
   the conductive layer contacts the ground electrode via the opening.

4. The display device of claim 1, wherein the first member extends to the flexible printed circuit board to cover at least a part of the flexible printed circuit board.

5. The display device of claim 4, wherein the first member does not overlap with the bending area.

6. The display device of claim 4, wherein the first member overlaps with the bending area.

7. The display device of claim 6, further comprising a first layer formed between the display area and the IC and covering the bending area.

8. The display device of claim 7, further comprising:
   a polarization layer disposed on the display panel;
   a first adhesive layer disposed on the polarization layer; and
   a cover window disposed on the first adhesive layer.

9. The display device of claim 8, wherein:
   a part of the first member contacts the first adhesive layer;
   a part of the first member is disposed between the first adhesive layer and the first layer; and
   the first layer and the first member abut the polarization layer.

10. The display device of claim 9, further comprising a support panel disposed between the display area and the drive IC,
    wherein the first layer comprises a protective layer and the first member comprises a first cover member.

11. The display device of claim 10, wherein the first member comprises a first insulating layer, a conductive layer disposed on the first insulating layer, and a second insulating layer disposed on the conductive layer.

12. The display device of claim 11, wherein the first insulating layer abuts the IC.

13. The display device of claim 11, wherein:
    the first insulating layer comprises a first non-conductive adhesive layer;
    the conductive layer comprises a conductive adhesive layer; and
    the second insulating layer comprises a second non-conductive adhesive layer.

14. A display device comprising:
a display panel having a display area and a non-display area, the non-display area being disposed at a peripheral portion of the display area and having a bending area;
an integrated circuit disposed in the non-display area to drive the display panel;
an output pad unit disposed on an outer side of the IC in the non-display area;
a flexible printed circuit board electrically connected to the output pad unit; and
a first member covering the integrated circuit,
wherein:
the first member directly contacts the integrated circuit; and
the first member comprises a first insulating layer, a conductive layer disposed on the first insulating layer, and a second insulating layer disposed on the conductive layer.

* * * * *